(12) United States Patent
Yoshikawa

(10) Patent No.: US 11,627,658 B2
(45) Date of Patent: Apr. 11, 2023

(54) PRINTED WIRING BOARD

(71) Applicant: IBIDEN CO., LTD., Gifu (JP)

(72) Inventor: Kyohei Yoshikawa, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/578,781

(22) Filed: Jan. 19, 2022

(65) Prior Publication Data

US 2022/0240379 A1     Jul. 28, 2022

(30) Foreign Application Priority Data

Jan. 22, 2021   (JP) .............................. JP2021-008629

(51) Int. Cl.
*H05K 1/02*             (2006.01)

(52) U.S. Cl.
CPC .................................. *H05K 1/0296* (2013.01)

(58) Field of Classification Search
CPC ...... H05K 1/0296; H05K 1/02; H05K 1/0298; H05K 1/118
USPC ........................................................ 174/251
See application file for complete search history.

(56) References Cited

U.S. PATENT DOCUMENTS

| | | | |
|---|---|---|---|
| 2021/0272898 A1* | 9/2021 | Takagi | .................. H01L 21/50 |
| 2022/0201852 A1* | 6/2022 | Chu | ........................ H05K 3/107 |

FOREIGN PATENT DOCUMENTS

JP             2000-022334 A      1/2000

* cited by examiner

*Primary Examiner* — Tremesha S Willis
(74) *Attorney, Agent, or Firm* — Oblon, McClelland, Maier & Neustadt, L.L.P.

(57) ABSTRACT

A printed wiring board includes a first insulating layer, a conductor layer on the first insulating layer, and a second insulating layer formed on the first insulating layer and covering the conductor layer. The conductor layer includes first, second and third circuits, the first circuit has first width of 15 μm or less, the first and second circuits have second space between the first and second circuits such that the second space has second width of 14 μm or less, the first and third circuits have third space between the first and third circuits such that the third space has third width of 20 μm or more, and the first circuit has first lower and upper surfaces, and second and third side walls such that second angle between the second wall and the first lower surface is larger than third angle between the third wall and the first lower surface.

20 Claims, 4 Drawing Sheets

PRINTED WIRING BOARD

CROSS-REFERENCE TO RELATED APPLICATIONS

The present application is based upon and claims the benefit of priority to Japanese Patent Application No. 2021-008629, filed Jan. 22, 2021, the entire contents of which are incorporated herein by reference.

BACKGROUND OF THE INVENTION

Field of the Invention

The present invention relates to a printed wiring board having a resin insulating layer and a conductor layer.

Description of Background Art

Japanese Patent Application Laid-Open Publication No. 2000-22334 describes a printed wiring board having conductor circuits and a resin insulating layer. The entire contents of this publication are incorporated herein by reference.

SUMMARY OF THE INVENTION

According to one aspect of the present invention, a printed wiring board includes a first resin insulating layer, a conductor layer formed on a surface of the first resin insulating layer, and a second resin insulating layer formed on the surface of the first resin insulating layer such that the second resin insulating layer is covering the conductor layer. The conductor layer includes a first conductor circuit, a second conductor circuit positioned to a first side of the first conductor circuit, and a third conductor circuit positioned to a second side of the first conductor circuit on the opposite side with respect to the first side, the first conductor circuit has a first width of 15 μm or less, the first conductor circuit and the second conductor circuit have a second space formed between the first conductor circuit and the second conductor circuit such that the second space has a second width of 14 μm or less, the first conductor circuit and the third conductor circuit have a third space formed between the first conductor circuit and the third conductor circuit such that the third space has a third width of 20 μm or more, and the first conductor circuit has a first lower surface in contact with the surface of the first resin insulating layer, a first upper surface on the opposite side with respect to the first lower surface, a second side wall facing the second conductor circuit, and a third side wall facing the third conductor circuit such that a second angle formed between the second side wall and the first lower surface is larger than a third angle formed between the third side wall and the first lower surface.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
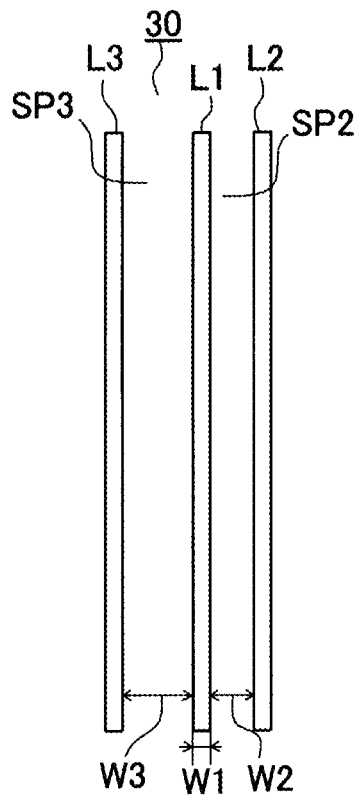
FIG. 1A is a plan view of a conductor layer of a printed wiring board according to an embodiment of the present invention.

Embodiments will now be described with reference to the accompanying drawings, wherein like reference numerals designate corresponding or identical elements throughout the various drawings.

Figure 4A:
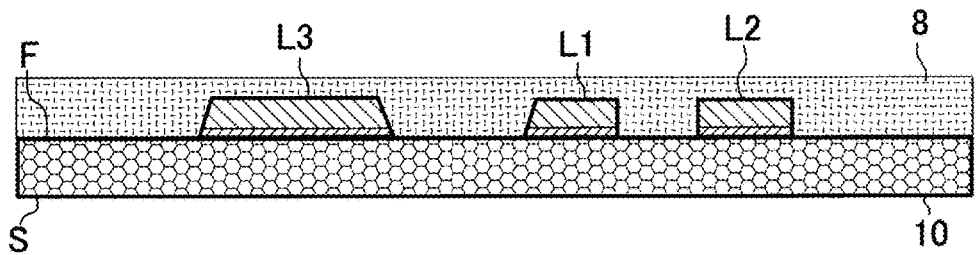
FIGS. 4A-4D are manufacturing process diagrams of the printed wiring board of the embodiment.
Figure 4B:
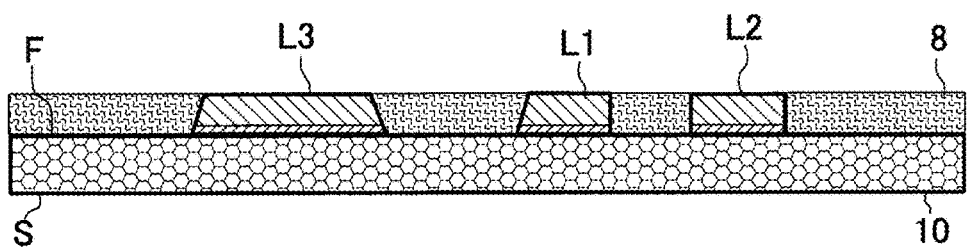
Figure 4C:
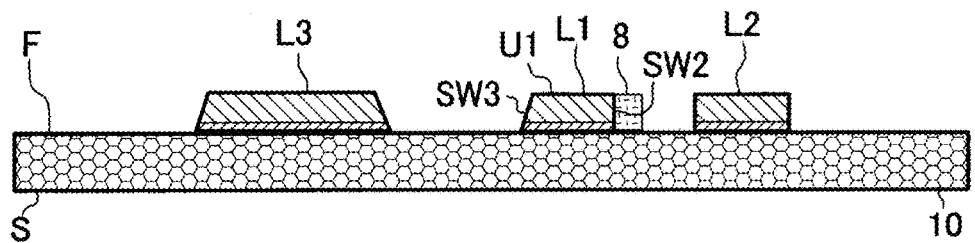
Figure 4D:
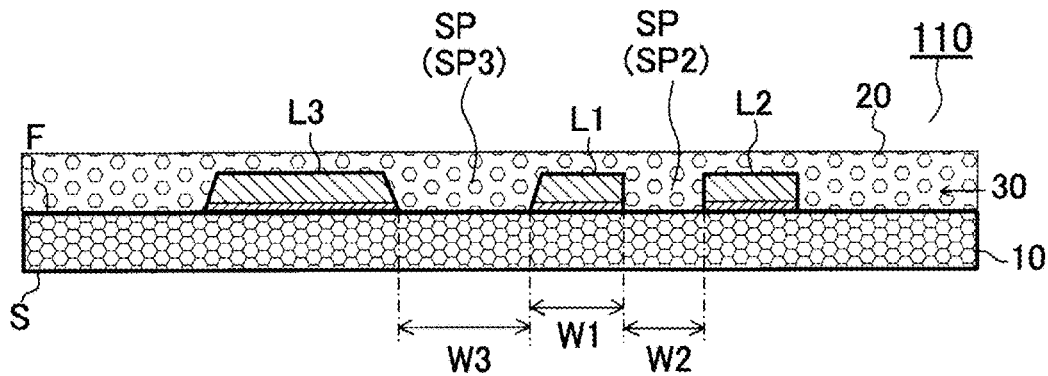

FIG. 4D illustrates a cross section of a printed wiring board 110 of an embodiment.

The printed wiring board 110 includes a first resin insulating layer 10 having a first surface (F) and a second surface (S) on the opposite side with respect to the first surface (F), a conductor layer 30 formed on the first surface (F) of the first resin insulating layer 10, and a second resin insulating layer 20 formed on the first surface (F) of the first resin insulating layer 10 and on the conductor layer 30. The second resin insulating layer 20 fills spaces (SP) between conductor circuits forming the conductor layer 30.

FIG. 1A is a plan view of the conductor layer 30 of the printed wiring board 110 of the embodiment.

The conductor layer 30 includes a first conductor circuit (L1) and conductor circuits (a second conductor circuit (L2) and a third conductor circuit (L3)) formed on both sides of the first conductor circuit (L1). The second conductor circuit (L2) is positioned to the right of the first conductor circuit (L1), and the third conductor circuit (L3) is positioned to the left of the first conductor circuit (L1).

Figure 1B:
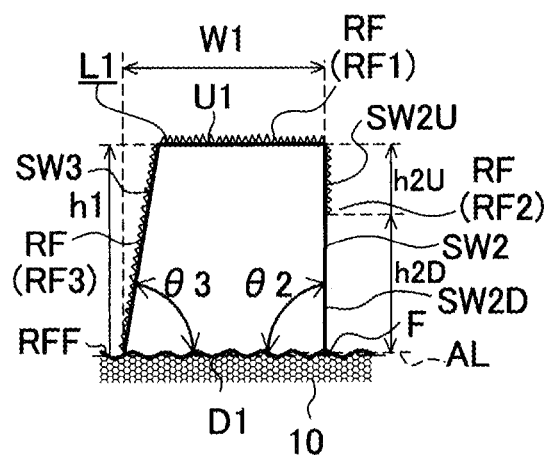
FIGS. 1B and 1C are each a cross-sectional view of a first conductor circuit.
Figure 1C:
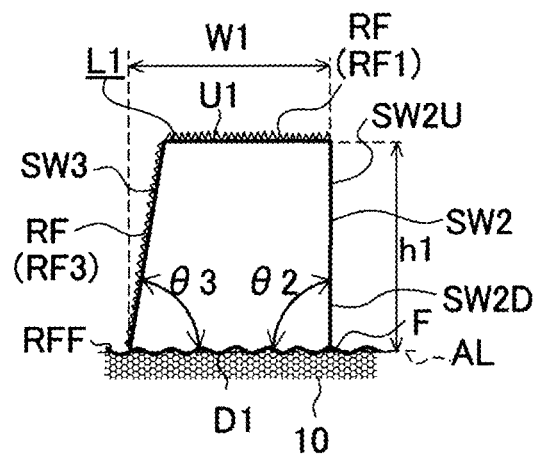

FIGS. 1B and 1C each illustrate a cross section of the first conductor circuit (L1). The first conductor circuit (L1) illustrated in FIG. 1C is a first example. The first conductor circuit (L1) illustrated in FIG. 1B is a second example. As illustrated in FIGS. 1B and 1C, the first surface (F) of the first resin insulating layer 10 has a first unevenness (RFF). When the first surface (F) has the first unevenness (RFF), the first surface (F) includes an average line (AL) of a roughness curve of the first unevenness (RFF). The average line (AL) is illustrated in FIGS. 1B and 1C.

As illustrated in FIGS. 1B and 1C, the first conductor circuit (L1) has a first lower surface (D1) in contact with the first surface (F) of the first resin insulating layer 10, a first upper surface (U1) on the opposite side with respect to the first lower surface (D1), a second side wall (SW2) facing the second conductor circuit (L2), and a third side wall (SW3) facing the third conductor circuit (L3). The second side wall (SW2) of the first conductor circuit (L1) is formed of an upper side second side wall (SW2U) extending from the first upper surface (U1) and a lower side second side wall (SW2D) extending from the first lower surface (D1). The first conductor circuit (L1) has a first width (W1). The first width (W1) is 15 μm or less. There is a second angle ($\theta 2$) between the second side wall (SW2) and the first lower surface (D1), and there is a third angle ($\theta 3$) between the third side wall (SW3) and the first lower surface (D1). The second angle ($\theta 2$) (second angle) is larger than the third angle ($\theta 3$) (third angle). The second angle ($\theta 2$) is substantially a right angle, and the third angle ($\theta 3$) is an acute angle. A difference between the third angle and the second angle is 5 degrees or more. The first conductor circuit (L1) has a substantially trapezoidal cross-sectional shape.

As illustrated in FIGS. 1A and 4D, there is a second space (SP2) between the first conductor circuit (L1) and the second conductor circuit (L2). There is a third space (SP3) between the first conductor circuit (L1) and the third conductor circuit (L3). The second space (SP2) has a second width (W2) and the third space (SP3) has a third width (W3). The second width (W2) is 14 μm or less. The third width (W3) is 20 μm or more.

The first width (W1), the second width (W2), the third width (W3), the second angle, and the third angle are determined from a plane containing a cross section of the first conductor circuit (L1). A cross section for measurement is obtained by cutting the printed wiring board 110 in a plane perpendicular to the first surface (F). The first width (W1), the second width (W2) and the third width (W3) are measured on the first surface (F).

When the first surface (F) has the first unevenness (RFF), the first width (W1), the second width (W2), and the third width (W3) are measured on the average line (AL) of the roughness curve of the first unevenness (RFF). The second angle ($\theta 2$) is between a straight line containing the second side wall (SW2) and the average line (AL), and the third angle ($\theta 3$) is between a straight line containing the third side wall (SW3) and the average line (AL).

Figure 2B:
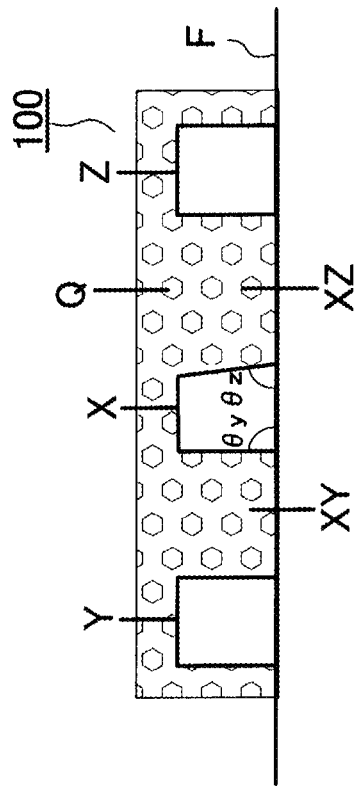
FIGS. 2A-2D are cross-sectional views reference examples.
Figure 2D:
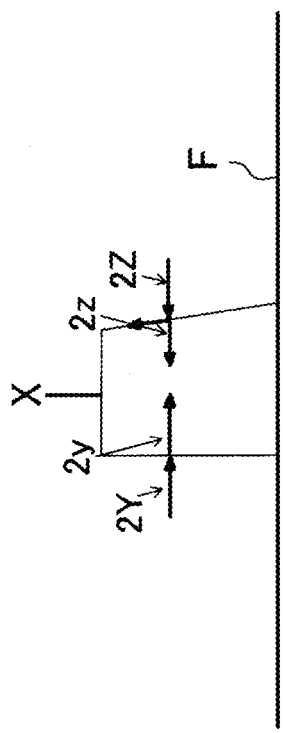
Figure 2A:
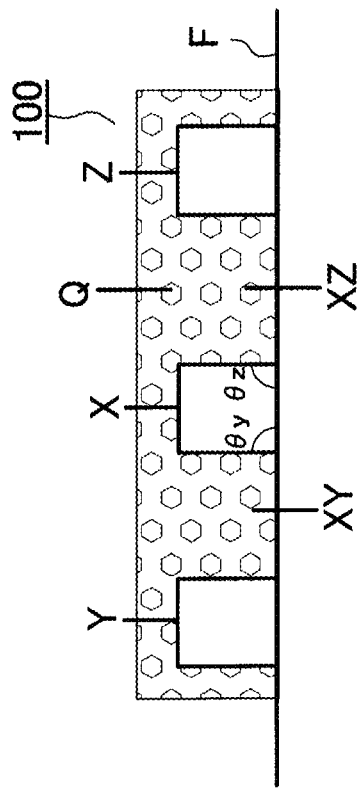

FIGS. 2A and 2B illustrate cross sections of printed wiring boards 100 of reference examples. FIG. 2A is Reference Example 1, and FIG. 2B is Reference Example 2. The reference examples each have a conductor circuit (X) and conductor circuits (a conductor circuit (Y) and a conductor circuit (Z)) formed on both sides of the conductor circuit (X). The conductor circuits (X, Y, Z) are formed on the first surface (F). There is a space (XY) between the conductor circuit (X) and the conductor circuit (Y). There is a space (XZ) between the conductor circuit (X) and the conductor circuit (Z). A width of the space (XZ) is larger than a width of the space (XY). The space (XY) and the space (XZ) are filled with a resin insulating layer (Q). The conductor circuit (X) has a side wall (side wall (Y)) facing the conductor circuit (Y), and a side wall (side wall (Z)) facing the conductor circuit (Z). A difference between Reference Example 1 and Reference Example 2 is a cross-sectional shape of the conductor circuit (X). In Reference Example 1, the conductor circuit (X) has a rectangular cross-sectional shape. In Reference Example 2, the conductor circuit (X) has a trapezoidal cross-sectional shape.

In Reference Example 1, an angle (angle ($\theta y$)) between the first surface (F) and the side wall (Y) and an angle (angle ($\theta z$)) between the first surface (F) and the side wall (Z) are 90 degrees.

In Reference Example 2, an angle (angle ($\theta y$)) between the first surface (F) and the side wall (Y) is 90 degrees. An angle (angle ($\theta z$)) between the first surface (F) and the side wall (Z) is less than 90 degrees. The angles ($\theta y$, $\theta z$) are depicted in FIGS. 2A and 2B.

Figure 2C:
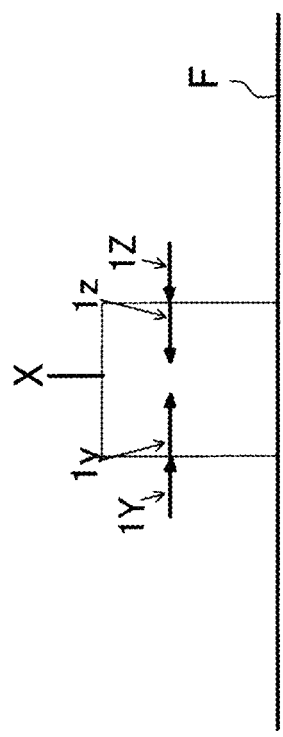

FIGS. 2C and 2D illustrate forces acting on the conductor circuit (X) of the reference examples. FIGS. 2C and 2D are prediction diagrams. FIG. 2C illustrates the conductor circuit (X) of Reference Example 1. FIG. 2D illustrates the conductor circuit (X) of Reference Example 2. Arrows (1Y, 1y, 1Z, 1z, 2Y, 2y, 2Z, 2z) in the drawings indicate the forces, and lengths of the arrows respectively schematically indicate magnitudes of the forces. Directions of the forces (1Y, 1y, 1Z, 1z, 2Y, 2y, 2Z, 2z) are parallel to the first surface (F).

The arrows (1Y, 1Z, 2Y, 2Z) indicate forces generated by expansion of the resin insulating layer (Q) in the space (XY) and the space (XZ). The width of the space (XZ) is larger than the width of the space (XY). Therefore, it is considered that the magnitudes of the forces (1Z, 2Z) due to the expansion of the resin insulating layer (Q) in the space (XZ) are larger than the magnitudes of the forces (1Y, 2Y) due to the expansion of the resin insulating layer (Q) in the space (XY).

The forces (1Z, 2Z, 1Y, 2Y) push the sidewalls of the conductor circuit (X). As a result, it is considered that the forces (1y, 1z, 2y, 2z) are transmitted into the conductor circuit (X).

In FIG. 2C, since the angle ($\theta y$) and the angle ($\theta z$) are 90 degrees, it is considered that the magnitude of the force (1Y) and the magnitude of the force (1y) are substantially equal to each other. It is considered that the magnitude of the force (1Z) and the magnitude of the force (1z) are substantially equal to each other. When the magnitude of the force (1Z) is larger than the magnitude of the force (1Y), it is considered that the conductor circuit (X) collapses.

In FIG. 2D, the angle ($\theta y$) is 90 degrees. Therefore, it is considered that the magnitude of the force (2Y) and the magnitude of the force (2y) are substantially equal to each other. The angle ($\theta z$) is less than 90 degrees. It is considered that the force (2Z) is dispersed along the side wall (Z) of the conductor circuit (X). It is considered that the magnitude of the force (2z) is smaller than the magnitude of the force (2Z). Therefore, it is considered that, even when the width of the space (XZ) is larger than the width of the space (XY), a difference between the magnitude of the force (2y) and the magnitude of the force (2z) is reduced. Even when the printed wiring board 100 is subjected to heat cycles, when the conductor circuit (X) has a cross-sectional shape as illustrated in FIG. 2D, it is considered that the conductor circuit (X) is unlikely to collapse.

In the embodiment, the second angle is larger than the third angle. And, the second angle is substantially 90 degrees. The cross-sectional shape of the first conductor circuit (L1) of the embodiment and the cross-sectional shape of Reference Example 2 are substantially the same as each other. Therefore, even when the first width (W1) is 15 μm or less, the second width (W2) is 14 μm or less, and the third width (W3) is 20 μm or more, the first conductor circuit (L1) is unlikely to collapse.

When the conductor layer 30 has a large thickness (h1), the first conductor circuit (L1) is likely to collapse due to heat cycles. Therefore, the thickness (h1) of the conductor layer 30 is 15 μm or less.

As illustrated in FIGS. 1B and 1C, the first upper surface (U1) of the first conductor circuit (L1) has a rough surface (RF) (RF1). The entire first upper surface (U1) has the rough surface (RF1). The third side wall (SW3) of the first conductor circuit (L1) has a rough surface (RF) (RF3). The entire third side wall (SW3) has the rough surface (RF3). At least a part of the second side wall (SW2) of the first conductor circuit (L1) does not have a rough surface (RF). In the second example illustrated in FIG. 1B, the upper side second side wall (SW2U) has a rough surface (RF) (RF2) and the lower side second side wall (SW2D) does not have a rough surface (RF). In the first example illustrated in FIG. 1C, the entire second side wall (SW2) does not have a rough surface (RF).

A length (h2U) of the upper side second side wall (SW2U) is shorter than a length (h2D) of the lower side second side wall (SW2D). A ratio ((the length (h2D))/(the length (h2U))) of the length (h2D) of the lower side second side wall (SW2D) to the length (h2U) of the upper side second side wall (SW2U) is 1.5 or more and 2 or less.

In the embodiment, a size of a rough surface (RF) is represented by an arithmetic mean roughness (Ra). When the size (arithmetic mean roughness (Ra)) of the rough surface (RF1) of the first upper surface (U1) is 0.5 μm or more and 1.0 μm or less, it is determined that the first upper surface (U1) has the rough surface (RF1). When the size (arithmetic mean roughness (Ra)) of the rough surface (RF3) of the third side wall (SW3) is 0.5 μm or more and 1.0 μm or less, it is determined that the third side wall (SW3) has the rough surface (RF3). When the size (arithmetic mean roughness (Ra)) of the rough surface (RF2) of the upper side second side wall (SW2U) is 0.5 μm or more and 1.0 μm or less, it is determined that the upper side second side wall (SW2U) has the rough surface (RF2). When the size (arithmetic mean roughness (Ra)) of the rough surface (RF) of the lower side second side wall (SW2D) is 0.5 μm or more and 1.0 μm or less, it is determined that the lower side second side wall (SW2D) has the rough surface (RF).

When the size (arithmetic mean roughness (Ra)) of the rough surface (RF) of the first upper surface (U1) is 0.01 μm or more and 0.2 μm or less, it is determined that the first upper surface (U1) does not have the rough surface (RF). When the size (arithmetic mean roughness (Ra)) of the rough surface (RF) of the third side wall (SW3) is 0.01 μm or more and 0.2 μm or less, it is determined that the third side wall (SW3) does not have the rough surface (RF). When the size (arithmetic mean roughness (Ra)) of the rough surface (RF) of the upper side second side wall (SW2U) is 0.01 μm or more and 0.2 μm or less, it is determined that the upper side second side wall (SW2U) does not have the rough surface (RF). When the size (arithmetic mean roughness (Ra)) of the rough surface (RF) of the lower side second side wall (SW2D) is 0.01 μm or more and 0.2 μm or less, it is determined that the lower side second side wall (SW2D) does not have the rough surface (RF).

For example, the second resin insulating layer 20 enters the second space (SP2) by pressing. The second space (SP2) is filled with the second resin insulating layer 20. The second resin insulating layer 20 enters the third space (SP3) by pressing. The third space (SP3) is filled with the second resin insulating layer 20.

In the printed wiring board 110 of the embodiment, the second width (W2) is 14 μm or less. The second width (W2) is preferably 5 μm or more. Since the second width (W2) is small, it is difficult to fill the second space (SP2) with the second resin insulating layer 20. However, as illustrated in FIGS. 1B and 1C, the second angle is substantially 90 degrees. Therefore, the second resin insulating layer 20 substantially directly enters the second space (SP2). Even at a low pressure, the second space (SP2) can be filled with the second resin insulating layer 20. Since the pressure is low, when the space (SP2) is filled with the second resin insulating layer 20, the first conductor circuit (L1) is unlikely to collapse. Even when the second width (W2) is small, the second space (SP2) is filled with the second resin insulating layer 20. Insulation resistance between the first conductor circuit (L1) and the second conductor circuit (L2) can be increased.

A rough surface (RF) on a side wall of a conductor circuit impedes filling of a space (SP) with the second resin insulating layer 20. The entire second side wall (SW2) does not have a rough surface (RF). In the example of FIG. 1C, no rough surface (RF) is formed on the entire second side wall (SW2). In the example of FIG. 1B, no rough surface (RF) is formed on a part of the second side wall (SW2). Therefore, even when the second width (W2) is small, the second resin insulating layer 20 easily enters the second space (SP2). Even when the second width (W2) is 10 μm or less, the second space (SP2) can be filled with the second resin insulating layer 20.

When the second width (W2) is 10 μm or more and 14 μm or less, it is difficult to fill the second space (SP2) with the second resin insulating layer 20. Therefore, when the width of the second space (SP2) is 10 μm or more and 14 μm or less, the second example illustrated in FIG. 1B can be adopted. When the second width (W2) is 10 μm or more and 14 μm or less, the lower side second side wall (SW2D) does not have a rough surface (RF) and the upper side second side wall (SW2U) has the rough surface (RF2).

When the second width (W2) is less than 10 μm it is more difficult to fill the second space (SP2) with the second resin insulating layer 20. Therefore, when the second width (W2) is less than 10 μm, the first example illustrated in FIG. 1C can be adopted. When the second width (W2) is less than 10 the entire second side wall (SW2) has no rough surface (RF).

In the first example, the entire second side wall (SW2) has no rough surface (RF). Therefore, when the second resin insulating layer 20 enters the space (SP2), the second resin insulating layer 20 can smoothly slide on the second side wall (SW2) of the first conductor circuit (L1). Therefore, when the second resin insulating layer 20 enters the space (SP2), the second resin insulating layer 20 does not strongly press the first conductor circuit (L1). When the second resin insulating layer 20 enters the space (SP2), the first conductor circuit (L1) is unlikely to collapse.

The smaller is a space (SP) between conductor circuits, the smaller is an amount of a resin that fills the space (SP). Even when the printed wiring board 110 is subjected to heat cycles, when a space (SP) between conductor circuits is small, an expansion amount and a contraction amount of a resin in the space (SP) are small. When the second width (W2) is 14 μm or less, even when a part of the second side wall (SW2) has no rough surface (RF), the second resin insulating layer 20 is unlikely to peel off from the first conductor circuit (L1). Even when the entire second side wall (SW2) has no rough surface (RF), the second resin insulating layer 20 is unlikely to peel off from the second side wall (SW2).

When the second angle is substantially 90 degrees, a contact area between the second resin insulating layer 20 and the second side wall (SW2) is small. When the printed wiring board 110 is subjected to heat cycles, the second resin insulating layer 20 is likely to peel off from the second side wall (SW2). However, when the second width (W2) is 14 μm or less, even when the second angle is substantially 90 degrees and no rough surface (RF) is formed on the entire second side wall (SW2), the second resin insulating layer 20 is unlikely to peel off from the second side wall (SW2).

The third width (W3) is 20 μm or more. Therefore, an expansion amount and a contraction amount of the second resin insulating layer 20 in the third space (SP3) are large. The second resin insulating layer 20 is likely to peel off from the second conductor circuit (L2). To prevent this problem, the third side wall (SW3) has the rough surface (RF3). The entire third side wall (SW3) has the rough surface (RF3). When the third side wall (SW3) has the rough surface (RF3), adhesive strength between the third side wall (SW3) and the second resin insulating layer 20 is strong. Therefore, it is considered that a stress due to the expansion and contraction of the second resin insulating layer 20 in the third space (SP3) strongly acts on the first conductor circuit (L1). When the first width (W1) of the first conductor circuit (L1) is 15 μm or less, the first conductor circuit (L1) is likely to collapse. However, since the third angle is less than 90 degrees, the first conductor circuit (L1) is unlikely to collapse. Even when the third side wall (SW3) has the rough surface (RF), since the third side wall (SW3) is inclined, the second resin insulating layer 20 easily enters the third space (SP3). Even when the third side wall (SW3) has the rough surface (RF3), the third space (SP3) can be filled with the second resin insulating layer 20.

When the third side wall (SW3) and the first upper surface (U1) have the rough surfaces (RF), the size of the rough surface (RF3) of the third side wall (SW3) is smaller than the size of the rough surface (RF1) of the first upper surface (U1). When the upper side second side wall (SW2U) and the first upper surface (U1) have the rough surfaces (RF), the size of the rough surface (RF2) of the upper side second side wall (SW2U) is smaller than the size of the rough surface (RF1) of the first upper surface (U1). The size of the rough surface (RF3) of the third side wall (SW3) and the size of the rough surface (RF2) of the upper side second side wall (SW2U) are substantially equal to each other. The size of the rough surface (RF3) on the third side wall (SW3) gradually decreases from the first upper surface (U1) toward the first lower surface (D1). The size of the rough surface (RF2) on the upper side second side wall (SW2U) gradually decreases from the first upper surface (U1) toward the first lower surface (D1).

A signal can be transmitted via the first conductor circuit (L1). The second side wall (SW2) of the first conductor circuit (L1) has no rough surface. Or, a part of the second side wall (SW2) has no rough surface. Therefore, even when the first width (W1) is 15 μm or less, a transmission loss can be reduced. The first conductor circuit (L1) can transmit a high-speed signal.

FIGS. 3A-3F and 4A-4D illustrate manufacturing processes of the printed wiring board 110 of the embodiment.

Figure 3A:
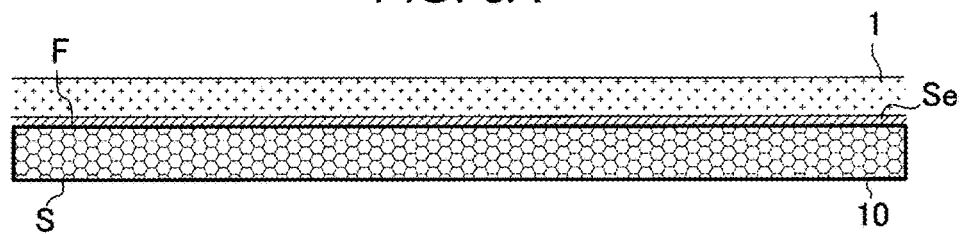
FIGS. 3A-3F are manufacturing process diagrams of the printed wiring board of the embodiment.
Figure 3B:
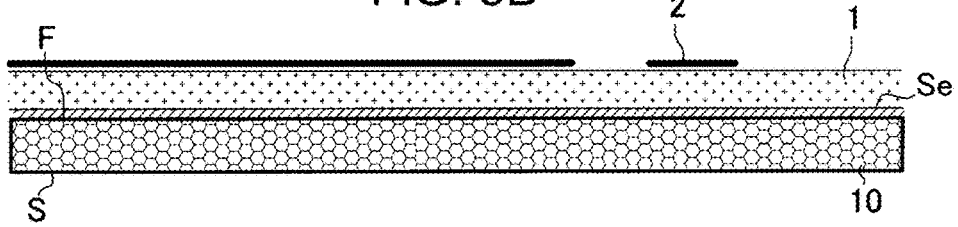
Figure 3C:
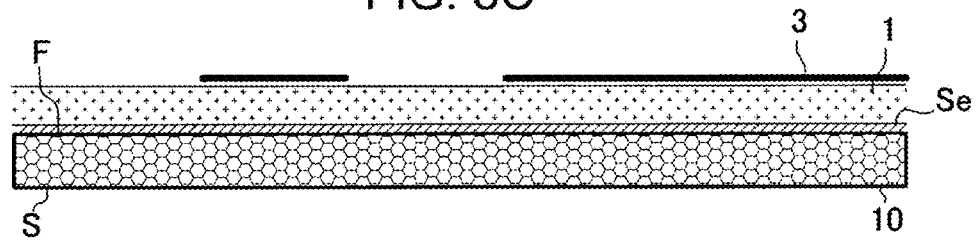
Figure 3D:
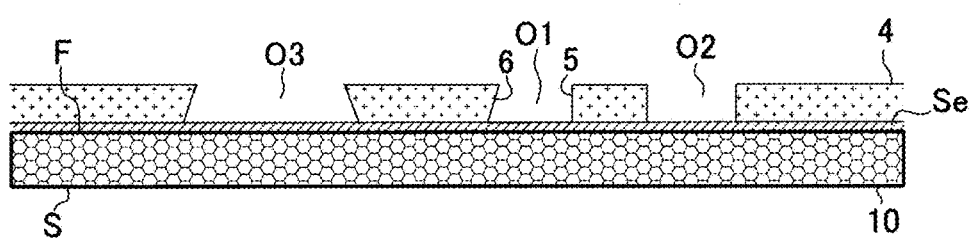
Figure 3E:
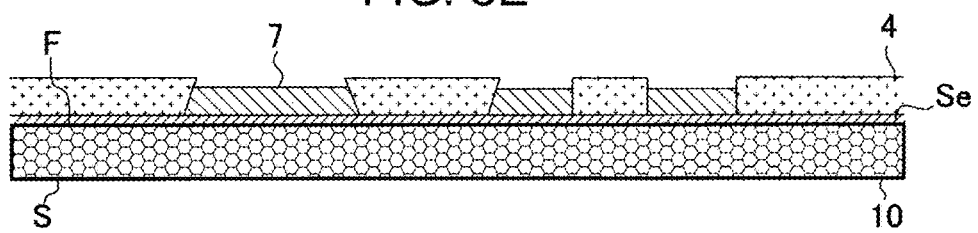
Figure 3F:
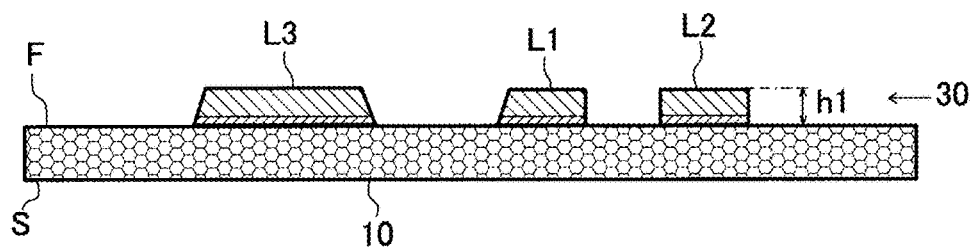

As illustrated in FIG. 3A, a seed layer (Se) is formed on the first resin insulating layer 10. A resist 1 for forming a plating resist 4 is formed on the seed layer (Se). The resist 1 is of a negative type. As illustrated in FIG. 3B, a mask 2 for exposure is placed on the resist 1. An exposure (first exposure) is performed in order to form the plating resist 4 for forming the second side wall (SW2) of the first conductor circuit (L1) and the second conductor circuit (L2). An exposure amount (first exposure amount) of the first exposure is appropriate. As illustrated in FIG. 3C, a mask 3 for exposure is placed on the resist 1. An exposure (second exposure) is performed in order to form the plating resist 4 for forming the third side wall (SW3) of the first conductor circuit (L1) and the third conductor circuit (L3). An exposure amount (second exposure amount) of the second exposure is smaller than the first exposure amount. The second exposure amount is less than an appropriate amount. Development is performed. As illustrated in FIG. 3D, the plating resist 4 having a first opening (O1) for the first conductor circuit (L1), a second opening (O2) for the second conductor circuit (L2), and a third opening (O3) for the third conductor circuit (L3) is formed on the seed layer (Se). The first exposure amount is appropriate. Therefore, an angle between a side wall 5 of the plating resist 4 for the second side wall (SW2) exposed by the first opening (O1) and the seed layer (Se) is a right angle. Since the second exposure amount is less than an appropriate amount, not enough light reaches the seed layer (Se). Therefore, an angle between a side wall 6 of the plating resist 4 for the third side wall (SW3) exposed by the first opening (O1) and the seed layer (Se) is an acute angle. An electrolytic plating film 7 is formed on the seed layer (Se) exposed from the openings (O1, O2, O3) of the plating resist 4. As illustrated in FIG. 3E, the electrolytic plating film 7 is formed in the openings (Op1, Op2, Op3). The plating resist 4 is removed. The seed layer (Se) exposed from the electrolytic plating film 7 is removed. The conductor layer 30 is formed (FIG. 3F). The conductor layer 30 includes the first conductor circuit (L1), the second conductor circuit (L2), and the third conductor circuit (L3). The first conductor circuit (L1) has a trapezoidal cross-sectional shape.

As illustrated in FIG. 4A, a resist 8 is formed on the first resin insulating layer 10 and the conductor layer 30. As illustrated in FIG. 4B, by polishing, an upper surface of the conductor layer 30 is exposed. As a result, the upper surface (first upper surface (U1)) of the first conductor circuit (L1) is exposed. Subsequently, using a photographic technology, the resist 8 is exposed and developed. In this case, the resist 8 is exposed such that the second side wall (SW2) is covered by the resist 8. As illustrated in FIG. 4C, the first upper surface (U1) and the third side wall (SW3) of the first conductor circuit (L1) are exposed. The intermediate substrate illustrated in FIG. 4C is immersed in a chemical solution for forming the rough surface (RF). As a result, the rough surface (RF) is formed on the first upper surface (U1) and the third side wall (SW3) of the first conductor circuit (L1). The second side wall (SW2) of the first conductor circuit (L1) is covered by the resist 8. Therefore, no rough surface is formed on the second side wall (SW2). Then, the resist 8 is removed. The second resin insulating layer 20 is formed on the first resin insulating layer 10 and the conductor layer 30. The printed wiring board 110 is completed (FIG. 4D).

The intermediate substrate illustrated in FIG. 4C can be irradiated with plasma. The plasma is irradiated from above the upper surface (first upper surface) (U1) of the first conductor circuit (L1). As a result, the upper side second side wall (SW2U) is exposed. The lower side second side wall (SW2D) is covered by the resist 8. After that, the rough surface (RF) is formed on the surfaces exposed to the outside. The rough surface (RF) is formed on the first upper surface (U1), the upper side second side wall (SW2U) and the third side wall (SW3) of the first conductor circuit (L1). The lower side second side wall (SW2D) is covered by the resist 8. Therefore, no rough surface (RF) is formed on the lower side second side wall (SW2D). Then, the resist 8 is removed. The printed wiring board 110 having the first conductor circuit (L1) illustrated in FIG. 1B is manufactured.

As illustrated in FIG. 6 of Japanese Patent Application Laid-Open Publication No. 2000-22334, a roughened layer is formed on the entire surfaces of the conductor circuits in Japanese Patent Application Laid-Open Publication No. 2000-22334.

In Japanese Patent Application Laid-Open Publication No. 2000-22334, a space between conductor circuits is filled with an interlayer resin insulating layer. FIG. 6 of Japanese Patent Application Laid-Open Publication No. 2000-22334 illustrates a cross-sectional shape of a conductor circuit. According to FIG. 6 of Japanese Patent Application Laid-Open Publication No. 2000-22334, the cross-sectional shape of the conductor circuit of Japanese Patent Application Laid-Open Publication No. 2000-22334 appears to be rectangular. When the printed wiring board is subjected to heat cycles, the interlayer resin insulating layer (resin insulating layer) that fills the space repeats expansion and contraction. It is thought that due to expansion, the conductor circuit is pressed. It is thought that due to contraction, the conductor circuit is pulled. Then, when the conductor circuit has a small width, it is predicted that the conductor circuit collapses due to an effect of expansion and contraction.

A printed wiring board according to an embodiment of the present invention includes: a first resin insulating layer having a first surface and a second surface on the opposite side with respect to the first surface; a conductor layer formed on the first surface; and a second resin insulating layer formed on the first surface and the conductor layer. The conductor layer includes a first conductor circuit and conductor circuits (a second conductor circuit and a third conductor circuit) positioned on both sides of the first conductor circuit. The second conductor circuit is positioned to the right of the first conductor circuit. The third conductor circuit is positioned to the left of the first conductor circuit. The first conductor circuit has a first lower surface in contact with the first surface, a first upper surface on the opposite side with respect to the first lower surface, a second side wall facing the second conductor circuit, and a third side wall facing the third conductor circuit. The first conductor circuit has a first width. There is a second space between the first conductor circuit and the second conductor circuit. The second space has a second width. There is a third space between the first conductor circuit and the third conductor circuit. The third space has a third width. There is a second angle between the second side wall and the first lower surface. There is a third angle between the third side wall and the first lower surface. The first width, the second width, and the third width are measured on the first surface. The first width is 15 µm or less. The second width is 14 µm or less. The third width is 20 µm or more. The second angle is larger than the third angle.

The printed wiring board according to an embodiment of the present invention includes the first conductor circuit and the conductor circuits (the second conductor circuit and the third conductor circuit) positioned on both sides of the first conductor circuit. The second space between the first conductor circuit and the second conductor circuit has a width of 14 µm or less. The third space between the first conductor circuit and the third conductor circuit has a width of 20 µm or more. The second space and the third space are filled with the second resin insulating layer. The first conductor circuit has the first lower surface, the second side wall facing the second conductor circuit, and the third side wall facing the third conductor circuit. Further, the first conductor circuit has the second angle between the first lower surface and the second side wall. The first conductor circuit has the third angle between the first lower surface and the third side wall. The second angle is larger than the third angle.

When the printed wiring board is subjected to heat cycles, the second resin insulating layer that fills the spaces repeats expansion and contraction. When the second resin insulating layer expands, it is considered that the second resin insulating layer presses the first conductor circuit. When the second resin insulating layer contracts, it is considered that the second resin insulating layer pulls the first conductor circuit. When the widths of spaces are large, it is considered that a force pressing the conductor circuit is larger. It is considered that a force pulling the conductor circuit is large. Since the sizes of the spaces sandwiching the first conductor circuit are different from each other, when the printed wiring board is subjected to heat cycles, it is considered that the first conductor circuit is pressed toward the second conductor circuit and then the first conductor circuit is pressed toward the third conductor circuit. And, the first conductor circuit has a width of 15 µm or less. Therefore, due to a stress caused by the heat cycles, the first conductor circuit is likely to collapse. However, the third angle is smaller than the second angle. Therefore, it is considered that a ratio (St3/St2) of a magnitude (St3) of a stress transmitted to the first conductor circuit via the third side wall to a magnitude (St2) of a stress transmitted to the first conductor circuit via the second side wall is close to 1. Therefore, even when the width of the first conductor circuit is 15 µm or less and the widths of the spaces sandwiching the first conductor circuit are different from each other, the first conductor circuit is unlikely to collapse.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a first resin insulating layer;
a conductor layer formed on a surface of the first resin insulating layer; and
a second resin insulating layer formed on the surface of the first resin insulating layer such that the second resin insulating layer is covering the conductor layer,
wherein the conductor layer includes a first conductor circuit, a second conductor circuit positioned to a first side of the first conductor circuit, and a third conductor circuit positioned to a second side of the first conductor circuit on an opposite side with respect to the first side, the first conductor circuit has a first width of 15 µm or less, the first conductor circuit and the second conductor circuit have a second space formed between the first conductor circuit and the second conductor circuit such that the second space has a second width of 14 µm or less, the first conductor circuit and the third conductor circuit have a third space formed between the first conductor circuit and the third conductor circuit such that the third space has a third width of 20 µm or more, and the first conductor circuit has a first lower surface in contact with the surface of the first resin insulating layer, a first upper surface on an opposite side with respect to the first lower surface, a second side wall facing the second conductor circuit, and a third side wall facing the third conductor circuit such that a second angle formed between the second side wall and the first lower surface is larger than a third angle formed between the third side wall and the first lower surface.

2. The printed wiring board according to claim 1, wherein the first conductor circuit is formed such that each of the first upper surface and the third side wall has a rough surface.

3. The printed wiring board according to claim 2, wherein the first conductor circuit is formed such that the first upper surface has the rough surface entirely, that the third side wall has the rough surface entirely, that the second side wall is formed by an upper side second side wall extending from the first upper surface and a lower side second side wall extending from the first lower surface, that the upper side second side wall has a rough surface, and that the lower side second side wall has no rough surface.

4. The printed wiring board according to claim 2, wherein the first conductor circuit and the second conductor circuit is formed such that the second width of the second space is 10 µm or less, and the first conductor is formed such that the first upper surface has the rough surface entirely, that the third side wall has the rough surface entirely, and that the second side wall has no rough surface entirely.

5. The printed wiring board according to claim 1, wherein the first conductor circuit is formed such that a difference between the second angle and the third angle is 5 degrees or more.

6. The printed wiring board according to claim 3, wherein the first conductor circuit is formed such that a length of the upper side second side wall is shorter than a length of the lower side second side wall.

7. The printed wiring board according to claim 6, wherein the first conductor circuit is formed such that a ratio of a length of the lower side second side wall to a length of the upper side second side wall is in a range of 1.5 to 2.

8. The printed wiring board according to claim 1, wherein the surface of the first resin insulating layer has unevenness and includes an average line of a roughness curve of the unevenness.

9. The printed wiring board according to claim 8, wherein the first, second and third conductor circuits are formed such that the first width, the second width, the third width, the second angle, and the third angle are determined from a plane that includes a cross section of the first conductor circuit.

10. The printed wiring board according to claim 9, wherein the first, second and third conductor circuits are formed such that the first width, the second width, and the third width are measured on the average line, that the second angle is an angle between a straight line that includes the average line and a straight line that includes the second side wall, and that the third angle is an angle between the straight line that the average line and a straight line that includes the third side wall.

11. The printed wiring board according to claim 2, wherein the first conductor circuit is formed such that an arithmetic mean roughness Ra of the rough surface is in a range of 0.5 µm to 2.0 µm.

12. The printed wiring board according to claim 3, wherein the first conductor circuit is formed such that an arithmetic mean roughness Ra of the rough surface is in a range of 0.5 µm to 2.0 µm, and that the lower side second side wall is determined to have no rough surface when an arithmetic mean roughness of the lower side second side wall is in 0.01 µm to 0.2 µm.

13. The printed wiring board according to claim 4, wherein the first conductor circuit is formed such that the second side wall is determined to have no rough surface when an arithmetic mean roughness of the second side wall is in a range of 0.01 µm to 0.2 µm.

14. The printed wiring board according to claim 1, wherein the conductor layer has a thickness in a range of 7 µm to 15 µm.

15. The printed wiring board according to claim 3, wherein the first conductor circuit and the second conductor circuit are formed such that the second width of the second space is larger than 10 µm.

16. The printed wiring board according to claim 2, wherein the first conductor circuit is formed such that a difference between the second angle and the third angle is 5 degrees or more.

17. The printed wiring board according to claim 16, wherein the first conductor circuit is formed such that the first upper surface has the rough surface entirely, that the third side wall has the rough surface entirely, that the second side wall is formed by an upper side second side wall extending from the first upper surface and a lower side second side wall extending from the first lower surface, that the upper side second side wall has a rough surface, and that the lower side second side wall has no rough surface.

18. The printed wiring board according to claim 16, wherein the first conductor circuit and the second conductor circuit is formed such that the second width of the second space is 10 µm or less, and the first conductor is formed such that the first upper surface has the rough surface entirely, that the third side wall has the rough surface entirely, and that the second side wall has no rough surface entirely.

19. The printed wiring board according to claim 17, wherein the first conductor circuit is formed such that a length of the upper side second side wall is shorter than a length of the lower side second side wall.

20. The printed wiring board according to claim 19, wherein the first conductor circuit is formed such that a ratio of a length of the lower side second side wall to a length of the upper side second side wall is in a range of 1.5 to 2.

* * * * *